US012650910B2

(12) United States Patent
Bartko et al.

(10) Patent No.: US 12,650,910 B2
(45) Date of Patent: Jun. 9, 2026

(54) DETECTION OF ANOMALIES IN BEHAVIOR OF A DEVICE UNDER TEST SUBJECTED TO DISTURBANCES USING AI ALGORITHM TRAINED ON OBSERVATIONS FROM WHEN THE DUT IS NOT SUBJECTED TO DISTURBANCES

(71) Applicant: Rohde & Schwarz GmbH & Co. KG, Munich (DE)

(72) Inventors: Hendrik Bartko, Unterhaching (DE); Rafid Ahmed, Munich (DE); Reiner Goetz, Oberhausen (DE); Georg Schwarz, Gröbenzell (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 72 days.

(21) Appl. No.: 18/433,705

(22) Filed: Feb. 6, 2024

(65) Prior Publication Data

US 2024/0330138 A1      Oct. 3, 2024

(30) Foreign Application Priority Data

Mar. 29, 2023    (EP) ..................................... 23165065

(51) Int. Cl.
*G06F 11/273* (2006.01)
*G01R 31/28* (2006.01)
*G06F 11/277* (2006.01)

(52) U.S. Cl.
CPC ........ *G06F 11/273* (2013.01); *G01R 31/2846* (2013.01); *G06F 11/277* (2013.01)

(58) Field of Classification Search
CPC . G06F 11/273; G06F 11/277; G01R 31/2855; G01R 31/2881; G01R 31/2846
See application file for complete search history.

(56) References Cited

U.S. PATENT DOCUMENTS 6,031,486 A * 2/2000 Anderson ................ B64G 7/00
                                            342/174
9,154,777 B2 * 10/2015 He ......................... H04N 17/04
                        (Continued)

FOREIGN PATENT DOCUMENTS

CN        114839466 A      8/2022
DE      102020208306 A1    1/2022
WO       2022218869 A1    10/2022

OTHER PUBLICATIONS

Extended European Search Report dated Aug. 29, 2023, for corresponding European Application No. 23165065.6, 11 pages.
(Continued)

*Primary Examiner* — Joseph O Schell
(74) *Attorney, Agent, or Firm* — Westman, Champlin & Koehler, P.A.

(57) ABSTRACT

The present invention relates to a method and an apparatus for detecting anomalies in an operation behavior of a device under test (DUT), in particular during electromagnetic susceptibility (EMS) measurements. The apparatus comprises a monitoring unit adapted to generate a first set of observation data of the operation behavior of a DUT while the DUT is not subjected to disturbances and adapted to generate a second set of observation data of the operation behavior of a DUT while the DUT is subjected to disturbances and comprising an AI module trained with the first set of observation data generated by the monitoring unit and adapted to process the second set of observation data to detect anomalies in the operation behavior of the DUT while being subjected to the disturbances and comprising a reporting unit adapted to reporting anomalies in the operation behavior of the DUT detected by the trained AI module.

17 Claims, 3 Drawing Sheets

(56)  References Cited

U.S. PATENT DOCUMENTS

| | | | |
|---|---|---|---|
| 10,223,842 | B1 | 3/2019 | Lee et al. |
| 11,477,547 | B1 * | 10/2022 | Abdelrazek ............. H04L 67/55 |
| 2013/0060502 | A1 * | 3/2013 | Dang ............ G01R 31/318544 |
| | | | 702/108 |
| 2014/0159764 | A1 * | 6/2014 | Al-Dahle ........... G01R 31/2853 |
| | | | 324/762.01 |
| 2018/0100890 | A1 * | 4/2018 | Duvvury .............. G01R 31/002 |
| 2018/0300865 | A1 * | 10/2018 | Weiss .............. G05B 19/41875 |
| 2020/0265110 | A1 * | 8/2020 | Cirillo ...................... G06N 7/01 |
| 2021/0302491 | A1 * | 9/2021 | Malisic ............... G01R 31/287 |
| 2021/0365796 | A1 | 11/2021 | Guezelarslan et al. |
| 2023/0076130 | A1 * | 3/2023 | Wen .................... G06F 11/3495 |
| 2023/0086626 | A1 * | 3/2023 | Pulikottil ........... G01R 31/2834 |
| | | | 73/160 |
| 2024/0053254 | A1 * | 2/2024 | Easterling .......... G01R 31/2874 |
| 2024/0085477 | A1 * | 3/2024 | Turman ................... H04Q 9/00 |
| 2024/0159844 | A1 * | 5/2024 | Klein ..................... G01R 31/64 |

OTHER PUBLICATIONS

Medico Roberto et al., "Machine-Learning-Based Error Detection and Design Optimization in Signal Integrity Applications," IEEE Transactions on Components, Packaging and Manufacturing Technology, IEEE, USA, vol. 9, No. 9, May 15, 2019 (May 15, 2019), pp. 1712-1720, XP011750665.

Medico Roberto et al., "Machine Learning Based Error Detection in Transient Susceptibility Tests," IEEE Transactions on Electromagnetic Compatibility, IEEE Service Center, New York, NY, US, vol. 61, No. 2, May 28, 2018 (May 28, 2018), pp. 352-360, XP011707944.

* cited by examiner

1

DETECTION OF ANOMALIES IN BEHAVIOR OF A DEVICE UNDER TEST SUBJECTED TO DISTURBANCES USING AI ALGORITHM TRAINED ON OBSERVATIONS FROM WHEN THE DUT IS NOT SUBJECTED TO DISTURBANCES

CROSS-REFERENCE TO RELATED APPLICATION

This application claims priority to European Patent Application Ser. No. 23/165,065.6, filed on Mar. 29, 2023, the content of which is hereby incorporated by reference.

FIELD OF THE INVENTION

The present invention relates to a method and an apparatus for detecting anomalies in an operation behavior of a device under test (DUT), in particular during electromagnetic susceptibility (EMS) measurements.

TECHNICAL BACKGROUND

A test software can be used to control complete Electromagnetic Compatibility (EMC) test systems to perform automated or interactive electromagnetic interference (EMI) and electromagnetic susceptibility (EMS) measurements on a device under test (DUT) to verify its compliance with relevant standards. Electromagnetic susceptibility (EMS) is the degree to which an electronic device malfunctions or breaks down when subjected to varying levels of EMI. Electromagnetic Interference and Electromagnetic Susceptibility include both radiated and conducted emissions.

Testing is mostly performed to detect anomalies or failures in an operation behavior of a device under test DUT. In a conventional test system this requires that a user defines manually regions of interest where to look for anomalies in the operation behavior of the investigated device under test, DUT. However, a manual definition of regions of interest by a user is a subjective and error prone. Moreover only known types of errors or failures can be detected in this way.

SUMMARY OF THE INVENTION

Against this background, the object of the present invention is to provide a method and an apparatus which allow to detect automatically anomalies in an operation behavior of a device under test DUT without the need to define manually regions of interest by a user.

This problem is solved according to the invention by a method and an apparatus having the features of the independent claims.

According thereto, the following is provided:

A method for detecting anomalies in an operation behavior of a device under test, DUT, comprising the steps of: monitoring the device under test, DUT, arranged in a test environment to generate a first set of observation data without subjecting the device under test, DUT, to disturbances; training an artificial intelligence, AI, algorithm with the generated first set of observation data; monitoring the at least one device under test, DUT, arranged in the test environment to generate a second set of observation data while subjecting the device under test, DUT, to disturbances; processing the second set of observation data by the trained artificial intelligence, AI, algorithm to detect anomalies in the operation behavior of the device under test, DUT, while being subjected to the disturbances; and reporting detected anomalies in the operation behavior of the device under test, DUT.

A test apparatus for detecting anomalies in an operation behavior of a device under test (DUT) arranged in a test environment of said test apparatus comprising: a monitoring unit adapted to generate a first set of observation data of the operation behavior of a device under test while the device under test is not subjected to disturbances and adapted to generate a second set of observation data of the operation behavior of a device under test while the device under test is subjected to disturbances; at least one artificial intelligence, AI, module trained with the first set of observation data generated by the monitoring unit and adapted to process the second set of observation data to detect anomalies in the operation behavior of the device under test while being subjected to the disturbances; and a reporting unit adapted to reporting anomalies in the operation behavior of the device under test (DUT) detected by the artificial intelligence, AI, module.

Advantageous configurations and developments emerge from the further dependent claims and from the description with reference to the figures of the drawings.

In a possible embodiment of the method the test environment comprises a test chamber into which the device under test, DUT, is placed.

In a possible embodiment of the method the detected anomalies in the operation behavior of the device under test, DUT, detected by the trained artificial intelligence, AI, algorithm are automatically reported in a notification report.

In a possible embodiment of the notification report provides a rating of a significance of a detected anomaly in the operation behavior of the device under test, DUT.

In a possible embodiment of the method the trained artificial intelligence algorithm determines a probability that the detected anomalies in the operational behavior of the device under test, DUT, go beyond changes of the operational behavior of the device under test, DUT, to be expected due to the disturbances.

In a possible embodiment of the method the notification report provides information where an anomaly in the operation behavior of the device under test, DUT, has been detected by the trained artificial intelligence, AI, algorithm.

In a possible embodiment of the method the disturbances to which the device under test, DUT, is subjected to generate the second set of observation data comprise electromagnetic disturbances, in particular electromagnetic radiation, In a possible embodiment of the method the disturbances to which the device under test, DUT, is subjected to generate the second set of observation data comprises mechanical disturbances, in particular vibrations.

In a possible embodiment of the method the disturbances to which the device under test, DUT, is subjected to generate the second set of observation data comprises environmental disturbances, in particular humidity, dust, temperature variations, pressure variations.

In a possible embodiment of the method the observation data comprises image data generated by at least one camera provided in the test environment.

In a possible embodiment of the method the observation data comprises audio data generated by at least one microphone provided in the test environment.

In a possible embodiment of the method the notification report is announced via a warning message, an alarm signal or via a log-file.

In a possible embodiment of the method monitoring of the at least one device under test, DUT, arranged in the test environment to generate the second set of observation data while subjecting the device under test, DUT, to disturbances is stopped automatically once a significant anomaly in the operation behavior of the device under test, DUT, has been detected by the trained artificial intelligence, AI, algorithm.

In a possible embodiment the test environment of the test apparatus comprises a test chamber used to receive the device under test.

In a possible embodiment the test apparatus further comprises at least one camera adapted to provide image data and/or at least one microphone adapted to provide audio data stored as observation data in a data memory of the test apparatus.

Where appropriate, the above-mentioned configurations and developments can be combined implementations can be combined with each other as desired, as far as this is reasonable. Further possible configurations, developments and implementations of the invention also include combinations, which are not explicitly mentioned, of features of the invention which have been described previously or are described in the following with reference to the embodiments. In particular, in this case, a person skilled in the art will also add individual aspects as improvements or supplements to the basic form of the present invention.

CONTENT OF THE DRAWINGS

The present invention is described in greater detail in the following on the basis of the embodiments shown in the schematic figures of the drawings, in which.

Figure 1:
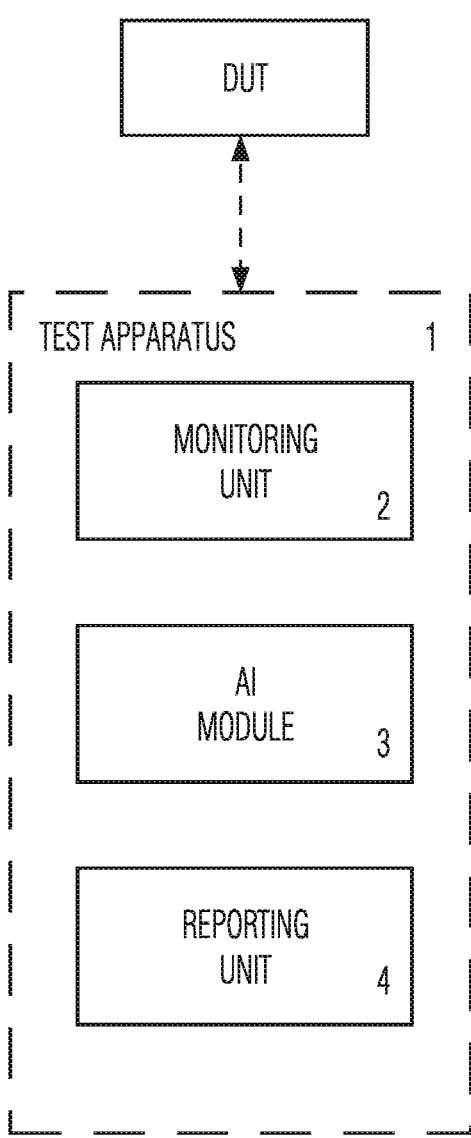
FIG. 1 shows a block diagram of a possible embodiment of a test apparatus according to an aspect of the present invention.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DESCRIPTION OF EMBODIMENTS

FIG. 1 illustrates a possible embodiment of a test apparatus 1 according to the present invention used for detecting anomalies in an operation behavior of a device under test, DUT, arranged in a test environment. The device under test DUT can be an electronic device.

The test apparatus 1 shown in FIG. 1 comprises a monitoring unit 2, an artificial intelligence module 3 and a reporting unit 4.

The monitoring unit 2 of the test apparatus 1 is adapted to generate a first set of observation data ODATA 1 of the operation behavior of a device under test DUT, while the device under test DUT is not subjected to disturbances D and is adapted to generate a second set of observation data ODATA 2 of the operation behavior of a device under test, DUT, while the device under test DUT is subjected to disturbances D.

The artificial intelligence, AI, module 3 of the test apparatus 1 is trained with the first set of observation data ODATA 1 generated by the monitoring unit 2 and is adapted to process the second set of observation data ODATA 2 to detect anomalies A in the operation behavior of the device under test DUT while being subjected to the disturbances D.

The reporting unit 4 of the test apparatus 1 is adapted to report anomalies A in the operation behavior of the device under test DUT detected by the artificial intelligence, AI, module 3 of the test apparatus 1.

Figure 2:
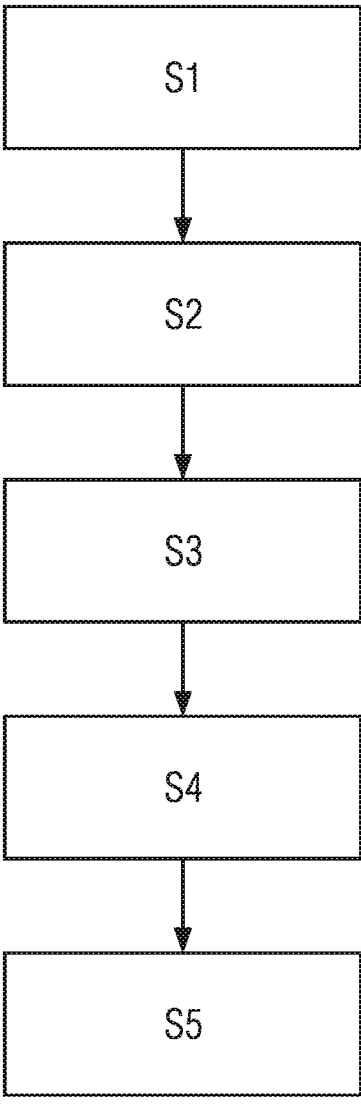
FIG. 2 shows a flow chart for illustrating a possible exemplary embodiment of the method according to the present invention.

FIG. 2 illustrates a flowchart of a possible exemplary embodiment of a method for detecting anomalies in an operation behavior of a device under test DUT according to a first aspect of the present invention. As can be seen in the illustrated flowchart the method comprises several main steps.

Figure 3:
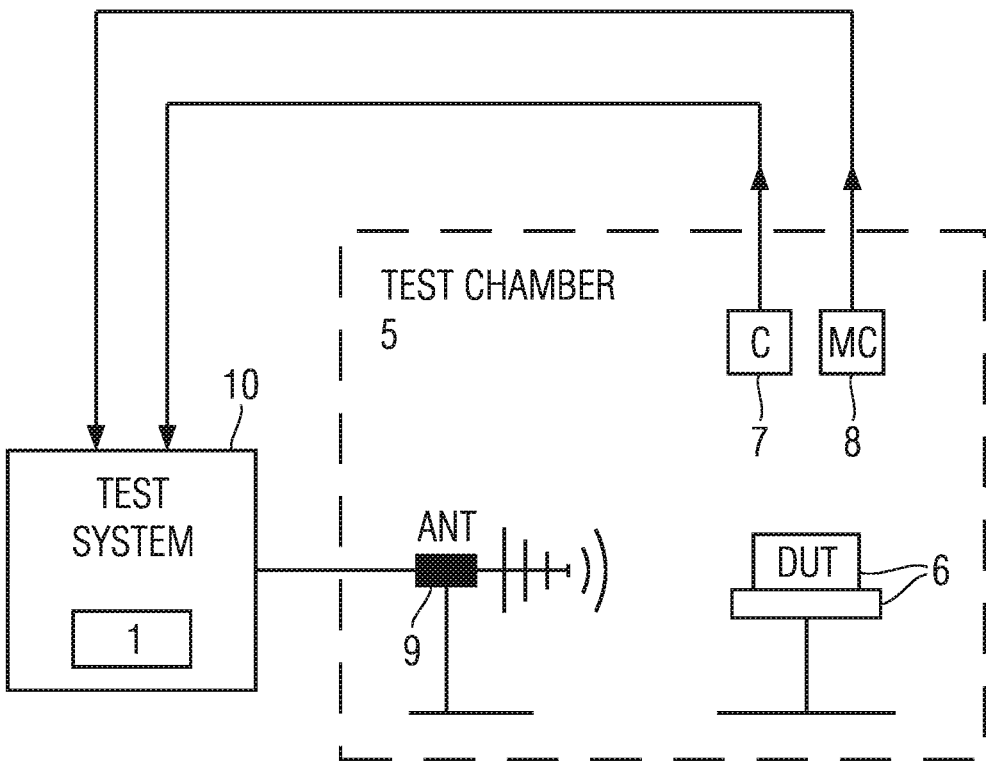
FIG. 3 shows schematically an exemplary test setup for performing a method according to the present invention.

In a first step S1 the device under test DUT arranged in a test environment is monitored by the monitoring unit 2 to generate a first set of observation data ODATA 1 without subjecting the device under test DUT to disturbances D. The test environment can comprise a test chamber 5 as illustrated in FIG. 3 into which the device under test DUT is placed for testing. The test chamber 5 can comprise a semi-anechoic chamber. The device under test DUT may perform an assigned operation task while performing the monitoring of the respective device under test DUT. This operation task can be for instance a communication process of the device under test DUT with another entity.

The device under test DUT arranged in the test environment is monitored in step S1 by the monitoring unit 2 for a time period Toff where the device under test DUT is not influenced or stimulated by applied disturbances D such as electromagnetic radiation.

The device under test DUT can be monitored by one or more cameras 7 of a monitoring unit 2. These cameras 7 can be provided in a test chamber 5 as shown in FIG. 3 where the device under test DUT has been placed and generate image data of the monitored device under test DUT. Further at least one microphone 8 connected to the monitoring unit 2 of the test apparatus 1 can be used to capture audio signals converted into audio data.

The first set of observation data ODATA 1 comprises in a possible embodiment image data generated by at least one camera 7 provided in the test environment, e.g. in the test chamber 5. The first set of observation data ODATA 1 can also comprise audio data generated by the at least one microphone 8 provided in the test environment, e.g. in the test chamber 5. The first set of observation data ODATA 1 may also comprise data output by the monitored device under test DUT via a wireless or wired data interface of the device under test DUT for instance while performing an assigned operation task.

In a second step S2 an artificial intelligence, AI, algorithm of the AI module 3 is trained with the first set of observation data ODATA 1 generated in step S1. The AI algorithm can be implemented by at least one artificial neural network ANN or by a random forest. The ANN can comprise an input layer, intermediate layers and an output layer. The input layer receives the observation data—from the monitoring unit 2 of the test apparatus 1. The output layer provides the classification result and can indicate a detected anomaly A.

The AI algorithm, e.g. the weights of the ANN, is trained for event recognition or outlier detection. More than one ANN may be provided for classification of different kinds of observation data such as image data or audio data and for detection of anomalies A.

In a third step S3 of the method illustrated in FIG. 2 the at least one device under test DUT arranged in the test environment is monitored by the monitoring unit 2 to generate a second set of observation data ODATA 2 while subjecting the device under test DUT to disturbances D. The disturbances D can be created by disturbance actuators of the test setup controlled by a control unit of the test apparatus 1. For instance the device under test DUT can be fixed on a vibrating plate 6 to apply vibrations and accelerating mechanical forces to the device under test DUT as illustrated in FIG. 3.

The device under test DUT arranged in the test environment is monitored in step S3 by the monitoring unit 2 for a time period Ton during which the device under test DUT is influenced by one or more kinds of applied disturbances D such as electromagnetic radiation or other disturbances. The sampling rate for sampling data samples of the second set of observation data ODATA 2 can be fixed or can be adjusted during application of the disturbances D. In a possible implementation specific kinds of applied disturbances D require higher sampling rates during monitoring of the device under test DUT to detect anomalies A in the operation behavior of the device under test DUT. The second set of observation data ODATA 2 is stored at least temporarily in a data memory of the test apparatus 1 for further processing by the trained AI module 3 of the test apparatus 1. The second set of observation data ODATA 2 can be stored along with associated stimulation data of the applied disturbances D.

The second set of observation data ODATA 2 generated in step S3 can comprise image data generated by the at least one camera provided in the test environment. The second set of observation data ODATA 2 can further comprise audio data generated by the at least one microphone provided in the test environment. The observation data may also comprise data output by the observed device under test DUT via a wireless or wired data interface of the respective device under test DUT, in particular while performing an assigned operation task.

The disturbances D to which the device under test, DUT, is subjected in step S3 to generate the second set of observation data ODATA 2 comprise in a possible embodiment of the method electromagnetic disturbances, in particular electromagnetic radiation. The disturbances D to which the device under test, DUT, is subjected in step S3 to generate the second set of observation data ODATA 2 can also comprise mechanical disturbances, in particular vibrations. The disturbances D to which the device under test, DUT, is subjected in step S3 to generate the second set of observation data ODATA 2 may further comprise environmental disturbances, in particular humidity, dust, temperature variations or pressure variations.

Different kinds of disturbances D can be applied in parallel and simultaneously to the device under test DUT. Various groups of disturbances D can be selected and activated for different test runs. Further the device under test DUT can undergo a predefined sequence of different disturbances (D1, D2, . . . . Dn). Also, an extent, amplitude, intensity, a change rate, a frequency or a duration of an applied disturbance D can be varied during testing of the device under test DUT. The applied disturbances D can reflect the operation circumstances of the device under test DUT to be expected during its normal operation for instance in a harsh environment. Anomalies A in the observed operation behavior of the device under test DUT can be caused by different applied disturbances D. On the other hand an applied disturbance D such as an electromagnetic radiation forms a stimulation of the device under test DUT that can cause at the same time different kinds of anomalies A in the operation behavior of the device under test DUT.

In a fourth step S4 of the method illustrated in FIG. 2 the second set of observation data ODATA 2 generated in step S3 is processed by the trained artificial, AI, algorithm of the AI module 3 to detect automatically anomalies A in the operation behavior of the device under test DUT while being subjected to various disturbances D. In a possible embodiment the trained artificial intelligence, AI, algorithm executed by the AI module 3 determines in step S4 also a probability P that detected anomalies A in the operational behavior of the device under test DUT go beyond changes of a normal operational behavior of the device under test DUT to be expected in response to applied normal disturbances D such as light vibration or due to noise.

As soon as an anomaly A has been detected the trained artificial intelligence, AI, algorithm one or more reactions can be triggered by the method. In step S5 of the method illustrated in FIG. 2 the detected anomalies A in the operation behavior of the device under test DUT can be reported by the reporting unit 4 of the test apparatus 1. The detected anomalies A in the operation behavior of the device under test DUT can be reported in step S5 by the reporting unit 4 of the test apparatus 1 in a notification report R. The notification report R provides in a possible embodiment a rating of a significance of a detected anomaly A in the operation behavior of the device under test DUT. For instance it may be stated that there is only a 1% chance or probability P that a detected anomaly A forms part of a normal expected operation behavior of the device under test DUT. The notification report R can further provide information where an anomaly A in the operation behavior of the device under test DUT has been detected by the trained artificial intelligence, AI, algorithm. For instance the report R may indicate an affected region on a dashboard of a car. The affected region of interest or affected area of the device under test DUT where an anomaly A in the operation behavior of the investigated device under test DUT has been detected by the trained artificial intelligence algorithm can also be displayed to a user on a display unit of the graphical user interface GUI of the test apparatus 1. In a possible embodiment the notification report R can be announced via a warning message or by a visual or acoustic alarm signal triggered in response to the detection of an anomaly A. Further event information can be stored in a log-file along with a time stamp.

In a possible embodiment of the method the monitoring of the at least one device under test DUT arranged in the test environment in step S3 to generate the second set of observation data ODATA 2 while subjecting the device under test, DUT, to disturbances D is stopped automatically once a significant or critical anomaly A in the operation behavior of the device under test DUT has been detected by the trained artificial intelligence, AI, algorithm in step S4. A critical anomaly comprises an anomaly A that affects negatively the operation capability of the tested device under test DUT. By stopping the application of the at least one disturbance D and the monitoring of the device under test DUT in response to a detected critical anomaly A the device under test DUT may be saved from being damaged or destroyed by the applied disturbances D.

In a possible embodiment the trained artificial or machine learned algorithm is adapted to mitigate or even compensate influences of the disturbances D such as vibrations applied during testing on the normal operation capability of the tested device under test DUT.

The test set up illustrated in FIG. 3 comprises a test system 10 comprising a test apparatus 1 that can perform automatic and interactive test procedures which deliver accurate results and allow in-depth analysis of EMI and EMS measurements during development and certification of a device under test DUT. At the same time, the test setup can speed up these processes. The test system 10 including the test apparatus 1 can perform EMS testing of a device under test DUT placed in a test chamber 5 of the test setup. The device under test DUT can fixed to a plate 6 driven by a controllable vibration motor to apply vibration disturbances to the attached device under test DUT. The test chamber 5 includes in the illustrated example of FIG. 3 a camera 7 adapted to generate image data of the device under test DUT supplied as observation data to the monitoring unit 2 of the test apparatus 1. Further the test chamber 5 comprises a microphone 8 adapted to capture audio signals emitted by the device under test DUT during testing in an audible or not audible frequency range. The audio signal that can be converted into audio data supplied as observation data to the monitoring unit 2 of the test apparatus 1 of the test system 10. Besides the camera 7 and the microphone 8 other sensors can be placed into the test chamber 5 to generate observation data of the investigated device under test DUT.

In the illustrated example the test setup comprises an antenna 9 as an exemplary disturbance generator adapted to generate electromagnetic radiation applied to the device under test DUT as a disturbance D while performing an assigned operation task. The test setup shown in FIG. 3 can be used as a radiated emission (RE) test setup where a receiver is a connected to the antenna 9 or as a radiated susceptibility (RS) test setup where the antenna 9 is connected to a transmitter. The antenna 9 can comprise a transmission antenna 9 receiving a signal from an amplifier of the test system 10. The test setup may include more than one antenna 9, for instance a first antenna for generating electromagnetic disturbances D and a second antenna for simulating or emulating a communication process performed by the device under test DUT during testing as an assigned operation task. Other actuators can be controlled by the test apparatus 1 to apply various disturbances D to the investigated device under test DUT. For instance a temperature within the test chamber 5 can be controlled and changed during the generation of the training observation data ODATA 1 and during the generation of the inference observation data ODATA 2 by a control unit of the test apparatus 1. The device under test DUT may also undergo other test runs outside the test chamber. For instance the DUT may be tested in the field or in other test facilities such as a wind cannel. The antenna 9 can generate digitally modulated interferer signals such as OFDM signals. Further the antenna 9 can in a further embodiment generate radar pulse interfere signals as disturbances D. In a possible implementation of the test setup the antenna 9 is replaceable for performing different test runs. In a possible implementation the notification report R includes an Identifier of the investigated DUT, a time stamp, the applied stimulations or disturbances D, in particular the applied interferer signals and the anomalies A, detected by the trained artificial intelligence algorithm. Each detected operation anomaly A can be caused by one or more applied disturbances D (A=f (D1, D2, Dn)). Several operation anomalies A can be analyzed by a processor of the test apparatus 1 to find correlations between occurrences of different anomalies A in response to different disturbances D.

A test software implementing the method according to the present invention can feature a predefined software library that covers common EMC standards including relevant limit lines, test setups and transducer factors to simplify a test configuration and does enable users to performing testing of the respective device under test DUT faster. A user can create DUT-specific test plans with multiple tests and configure test templates, hardware setups and notification report templates. A user interface UI of the test apparatus 1 can be provided to provide a quick and easy access to required functions and parameters. Favorite items and tagging and search functions can enhance usability and can facilitate navigation through huge amounts of observation data created by the method during EMS testing.

Frequently used elements such as DUT test plans, hardware setups, test templates, test results and reports can be pinned in a possible embodiment to a dashboard of the test apparatus 1 for quick and convenient access. It is possible to apply user-defined tags to organize and classify elements. Filters can be used to narrow down search results by frequency range or measurement category. The test software implementing the method according to the present invention introduces in a preferred embodiment an all-on-one-page user interface UI so that users do not have to constantly switch between different windows. This design makes test configuration easy as it provides quick access to all functions and parameters needed to generate user-defined tests. Users can open multiple tests in multiple windows to view and compare observation data.

A large library can be created using a configuration wizard that provides predefined test setups in accordance with common EMC standards. These to test setups enable users instantaneously perform tests with minimal preparation. The increasing complexity of DUTs results in a need to meet multiple requirements from various EMC standards. The test software gives users the ability to build and manage a test plan around a specific device under test DUT. This prevents users from missing a test and helps to generate a comprehensive notification report R by the reporting unit 4 of the test apparatus 1.

The test software implementing the method according to the present invention can accelerate the hardware configuration process by automatically detecting connected instruments available for testing. The test software is designed in a preferred embodiment for compatibility with powerful EMC test equipment to boost testing speed with automated test execution to increase test though put.

The test software implementing the method according to the present invention can provide an automated test execution by controlling and monitoring the used instruments. Automated test execution and interactive testing can be toggled to enable in-depth debugging. Users can simulate and validate test configurations and procedures prior to the actual test run to ensure that hardware resources are used efficiently. These test procedures can comprise selected and activated disturbances D. The test software increases productivity since it allows interactive operation, e.g. configuring tests and generating test and anomaly detection report templates for notification reports R, in parallel with automated test execution. Multiple windows can be opened on the same screen of the user interface UI of the test apparatus 1, enabling users to compare different test runs. The test software implementing the method according to the present invention performs automated disturbance measurements to provide the second set of observation data ODATA 2 processed by the trained artificial intelligence, AI, algorithm of the test software.

The test software automatically controls in a possible embodiment the test equipment generating EMS test levels and manages amplifier band and signal path switching. It can also monitor the device under test DUT on multiple channels using appropriate test equipment. The test software can further automatically switch the phases of artificial mains networks when measuring conducted disturbances. The method can save all measured observation data values in a data memory for data reduction and further data analysis or processing by the artificial intelligence, AI, module 3 of the test apparatus 1. The test software can automatically collect, analyze and evaluate observation data for each individual test performed. The reporting unit 4 of the test apparatus 1 can generate and save test reports and anomaly notification reports R as PDF or DOCX files. The reports R can be stored in a database of the test system 10 or in a data cloud.

Although the present invention has been described in the above by way of preferred embodiments, it is not limited thereto, but rather can be modified in a wide range of ways. In particular, the invention can be changed or modified in various ways without deviating from the core of the invention.

What we claim is:

1. A method for detecting anomalies in an operation behavior of a device under test, DUT, the method comprising:

monitoring the device under test, DUT, arranged in a test environment to generate a first set of observation data of the operation behavior of the device under test, DUT, in a time period where the device under test, DUT, is not subjected to disturbances;

training an artificial intelligence, AI, algorithm implemented as an artificial neural network, using only the generated first set of observation data of the operational behavior of the device under test, DUT, during the time period where the DUT was not subject to disturbances, thereby excluding any observation data acquired while the DUT is subjected to disturbances;

monitoring the device under test, DUT, arranged in the test environment to generate a second set of observation data of the operation behavior of the device under test, DUT, while subjecting the device under test, DUT, to disturbances, wherein the disturbances to which the device under test, DUT, is subjected to generate the second set of observation data comprise at least one of the following:

electromagnetic disturbances, mechanical disturbances, environmental disturbances; and processing the second set of observation data by the trained artificial intelligence, AI, algorithm to detect anomalies in the operation behavior of the device under test, DUT, in a time period where the device under test is subjected to the disturbances; and reporting detected anomalies in the operation behavior of the device under test, DUT.

2. The method of claim 1, wherein the test environment comprises a test chamber into which the device under test, DUT, is placed.

3. The method of claim 1, wherein the detected anomalies in the operation behavior of the device under test, DUT, detected by the trained artificial intelligence, AI, algorithm are automatically reported in a notification report.

4. The method of claim 3, wherein the notification report provides a rating of a significance of a detected anomaly in the operation behavior of the device under test, DUT.

5. The method of claim 3, wherein the notification report provides information where an anomaly in the operation behavior of the device under test, DUT, has been detected by the trained artificial intelligence, AI, algorithm.

6. The method of claim 3, wherein the notification report is announced via a warning message, an alarm signal or via a log-file.

7. The method of claim 1, wherein the trained artificial intelligence, AI, algorithm determines a probability that the detected anomalies in the operational behavior of the device under test, DUT, go beyond changes of the operational behavior of the device under test, DUT, to be expected due to disturbances.

8. The method of claim 1, wherein the electromagnetic disturbances are electromagnetic radiation generated by an antenna.

9. The method of claim 1, wherein the mechanical disturbances are vibrations applied by a plate.

10. The method of claim 1, wherein the environmental disturbances are at least one of the following:

humidity, dust, temperature variations, pressure variations.

11. The method of claim 1, wherein the two sets of observation data comprises image data generated by at least one camera provided in the test environment.

12. The method of claim 1, wherein the two set of observation data comprises audio data generated by at least one microphone provided in the test environment.

13. The method of claim 1, wherein the method is stopped automatically once a significant anomaly in the operation behavior of the device under test, DUT, has been detected by the trained artificial intelligence, AI, algorithm.

14. A test apparatus for detecting anomalies in an operation behavior of a device under test, DUT, arranged in a test environment of said test apparatus, the test apparatus comprising:

a monitoring unit adapted to generate a first set of observation data of the operation behavior of a device under test, DUT, in a time period where the device under test, DUT, is not subjected to disturbances and adapted to generate a second set of observation data of the operation behavior of a device under test, DUT, in a time period where the device under test (DUT) is subjected to disturbances, wherein the disturbances to which the device under test, DUT, is subjected to generate the second set of observation data comprise at least one of the following:

electromagnetic disturbances, mechanical disturbances, environmental disturbances;

an artificial intelligence, AI, module trained with the first set of observation data generated by the monitoring unit and adapted to process the second set of observation data to detect anomalies in the operation behavior of the device under test, DUT, while being subjected to the disturbances; and a reporting unit adapted to reporting anomalies in the operation behavior of the device under test, DUT, detected by the artificial intelligence, AI, module.

15. The test apparatus of claim 14, wherein the test environment of the test apparatus comprises a test chamber used to receive the device under test, DUT.

16. The test apparatus of claim 14, further comprising at least one camera adapted to provide image data or at least one microphone adapted to provide audio data stored as observation data for each set of observation data in a data memory of the test apparatus.

17. A non-transitory computer readable medium comprising a test software adapted to perform a method for detecting anomalies in an operation behavior of a device under test, DUT, the method comprising:

monitoring the device under test, DUT, arranged in a test environment to generate a first set of observation data of the operation behavior of the device under test, DUT, in a time period where the device under test, DUT, is not subjected to disturbances;

training an artificial intelligence, AI, algorithm with the generated first set of observation data of the operational behavior of the device under test, DUT, while the device is not subjected to disturbances;

monitoring the device under test, DUT, arranged in the test environment to generate a second set of observation data of the operation behavior of the device under test, DUT, while subjecting the device under test, DUT, to disturbances; and processing the second set of observation data by the trained artificial intelligence, AI, algorithm to detect anomalies in the operation behavior of the device under test, DUT, in a time period where the device under test is subjected to the disturbances; and reporting detected anomalies in the operation behavior of the device under test, DUT.

\* \* \* \* \*